United States Patent [19]

Suzuki et al.

[11] Patent Number: 5,798,856
[45] Date of Patent: Aug. 25, 1998

[54] OPTICAL PULSE GENERATOR

[75] Inventors: Masatoshi Suzuki, Kawashima; Hideaki Tanaka, Koganei; Yuichi Matsushima, Tokorozawa, all of Japan

[73] Assignee: Kokusai Denshin Denwa Kabushiki Kaisha, Tokyo, Japan

[21] Appl. No.: 341,261

[22] Filed: Nov. 16, 1994

Related U.S. Application Data

[62] Division of Ser. No. 7,550, Jan. 22, 1993, Pat. No. 5,394,260.

[30] Foreign Application Priority Data

Feb. 3, 1992 [JP] Japan .................. 4-046390
Apr. 23, 1992 [JP] Japan .................. 4-129353

[51] Int. Cl.[6] .................................................... H04B 10/04
[52] U.S. Cl. ....................................... 359/181; 385/8
[58] Field of Search ................................. 359/180, 181, 359/188, 163; 385/2, 3, 8; 372/26, 38

[56] References Cited

U.S. PATENT DOCUMENTS

| | | | |
|---|---|---|---|
| 4,934,775 | 6/1990 | Koai | 385/3 |
| 5,040,865 | 8/1991 | Chen et al. | 385/2 |
| 5,199,086 | 3/1993 | Johnson et al. | 385/2 |
| 5,249,243 | 9/1993 | Skeie | 385/3 |
| 5,434,693 | 7/1995 | Tanaka et al. | 395/180 |
| 5,515,196 | 5/1996 | Kitajima et al. | 359/180 |

*Primary Examiner*—Rafael Bacares
*Attorney, Agent, or Firm*—Lackenbach Siegel Marzullo Aronson & Greenspan, P.C.

[57] ABSTRACT

The short optical pulse generator is provided with a semiconductor laser which oscillates continuously at a single wavelength, a semiconductor electro-absorption type optical modulator which performs the intensity modulation of the output light from the laser, and a sinusoidal voltage generator and a DC voltage generator for driving the electro-absorption type optical modulator. A DC voltage is applied to the electro-absorption type optical modulator so that the output light from the laser is sufficiently extinguished. By applying a sinusoidal voltage to the optical modulator, short optical pulses are generated.

5 Claims, 11 Drawing Sheets

OPTICAL PULSE GENERATOR

This is a divisional application of application Ser. No. 08/007,550, filed Jan. 22, 1993, and now Pat. No. 5,394,260, granted Feb. 28, 1995.

BACKGROUND OF THE INVENTION

The present invention relates to an optical soliton pulse generator for high-speed fiber optic communication.

With the recent progress of optical amplification techniques, the fiber optic communication technology is now advancing toward ultra-long distance communication and it is becoming a reality to implement fiber optic communication across the Pacific Ocean without using any regenerative repeaters. With conventional transmission systems, however, an increase in the transmission rate allows the influence of deterioration of the transmission characteristic to grow which is based on the wavelength dispersion characteristic and nonlinear optical effect of the optical fiber, imposing limitations on the high-speed, large-capacity transmission. In recent years an optical soliton communication system has been in the limelight as a system which surmounts the limitations on the speeding up of transmission owing to the wavelength dispersion characteristic and the nonlinear optical effect. The optical soliton communication system is a system that makes positive use of wavelength dispersion characteristic and nonlinear optical effect of the optical fiber which are contributing factors to the deterioration of the transmission characteristics of prior art systems and that transmits optical short pulses intact while balancing the broadening of pulses by the wavelength dispersion in the optical fiber and the compression of pulses based on the nonlinear optical effect. A time multiplex and a wavelength multiplex system are also relatively easy to implement and are suitable for high-speed and large-capacity transmission. Heretofore, a pulse light source for the optical soliton communication has been implemented by a semiconductor mode locked laser with an external cavity or a gain switched semiconductor laser.

To realize the soliton communication utilizing the optical fiber, an optical soliton pulse generating technique is of importance. The conditions for the optical pulse are that its temporal waveform is in the shape of a squared hyperbolic secant ($sech^2 t$, where $t$ is time) and that its frequency spectrum does not excessively broaden and is expressed by a Fourier transformation of the temporal waveform (a Fourier transform limit). That is, it is necessary that the product of the full width at half maximum of the temporal waveform and the full width at half maximum of the frequency spectrum be 0.315.

To suppress interference between adjacent optical pulses which occurs on the optical fiber transmission line, it is desirable that the pulse width be 20% of or less than the pulse interval.

Incidentally, in an experimental optical soliton communication system at present, optical pulses are used when the product of the full width at half maximum of the temporal waveform and the full width at half maximum of the frequency spectrum is within 0.441 or so.

A semiconductor mode locked laser with an external cavity, which is a typical example of conventional optical pulse generators, has a construction in which one end face of the laser diode is given an anti-reflection coating, a reflector is disposed in front of the said one end face and the other end face of the laser diode and the reflector constitute an optical resonator. Since the semiconductor laser is driven by a sinusoidaly modulated current signal synchronized with the light round trip time of the optical resonator, the modulation rate is fixed to the length of the optical resonator and the product of the full width at half maximum of the temporal waveform and the full width at half maximum of the frequency spectrum exceeds 0.5. Moreover, this method presents a problem in its long-term stability as it employs the optical resonator which is susceptible to changes in environmental conditions, for example, a temperature change or mechanical vibration.

On the other hand, according to the gain switching method which drives the semiconductor laser directly with short current pulses, the modulation rate is not fixed in principle, but in practice, it is hard to change the modulation rate arbitrarily, because it is inevitable to use a resonator type microwave circuit such as a comb generator. With this method, the frequency spectrum excessively broadens more than in the case of employing the semiconductor mode locked laser, and the product of the full width at half maximum of the temporal waveform and the full width at half maximum of the frequency spectrum becomes greater than 1. Consequently, no soliton optical pulses can be obtained in this case; hence, it is necessary to use a new technique for suppressing the excess spectral brodening, such as a narrow-band optical filter.

In either case, since the oscillation wavelength of the laser undergoes substantial changes with its direct modulation, the spectrum of pulses broadens excessively and they cannot be used intact as optical pulses for the soliton communication. Furthermore, it is difficult to implement an optical soliton pulse generator which is stable for a long period of time.

SUMMARY OF THE INVENTION

It is therefore an object of the present invention to provide a short optical pulse generator for the soliton communication which obviates the above-mentioned defects of the prior art and which is variable in modulation rate and hence is capable of generating optical pulses free from excessive broadening of their spectra.

In an aspect, the present invention relates to an optical pulse generator which is characterized by the provision of: a semiconductor laser which oscillates continuously at a single wavelength; a semiconductor electro-absorption type optical modulator which performs intensity modulation of the output light from the semiconductor laser; a DC voltage source which applies to the optical modulator a reverse DC voltage large enough to extinguish the output light of the semiconductor laser; and a sinusoidal voltage generator which applied a sinusoidal voltage to the optical modulator.

In another aspect, the present invention relates to an optical pulse generator which is characterized by the provision of: a semiconductor laser which oscillates continuously at a single wavelength; a first optical modulator which performs intensity modulation of the output light of the semiconductor laser; a second optical modulator which performs intensity modulation of the output light of the first optical modulator; a rectangular wave generator which generates a rectangular pulse voltage for driving the first and second optical modulators; and a delay circuit which is provided between the second optical modulator and the rectangular wave generator to delay the rectangular pulse voltage of the rectangular voltage generator for a predetermined period of time.

In still another aspect, the present invention relates to an optical pulse generator which is characterized by the provision of: a semiconductor laser which oscillates continuously at a single wavelength; a first semiconductor electro-absorption type optical modulator which performs intensity modulation of the output light from the semiconductor laser; a second semiconductor electro-absorption type optical modulator which performs intensity modulation of the output light from the first semiconductor electro-absorption type optical modulator; a sinusoidal voltage generator which generates a sinusoidal voltage for driving the first and second semiconductor electro-absorption type optical modulators; a DC voltage generator which applies a reverse DC voltage to the first and second semiconductor electro-absorption type optical modulators; and a delay circuit which is provided between the second semiconductor electro-absorption type optical modulator and the sinusoidal voltage generator to delay the sinusoidal voltage of the sinusoidal voltage generator for a predetermined period of time.

The first-mentioned optical pulse generator applies semiconductor laser beams of a fixed intensity to the semiconductor electro-absorption type optical modulator and generates therefrom optical pulses through utilization of a nonlinear characteristic of the optical modulation that its optical output shows a monotonous decrease substantially exponentially with an increase in the applied voltage. This characteristic is inherent in the semiconductor electro-absorption type optical modulator and is not found in a dielectric optical modulator whose optical output periodically varies with an increase in the applied voltage. By applying to the semiconductor electro-absorption type optical modulator a DC voltage biased to a point where its optical output is sufficiently attenuated and then by applying to the optical modulator a sinusoidal voltage of an amplitude about twice larger that of the DC voltage, the optical output pulse of the optical modulator automatically becomes shorter than the sinusoidal voltage by virtue of its nonlinear optical output characteristic mentioned above and the semiconductor electro-absorption type optical modulator can be operated so that it becomes transparent for a short period of time. Thus, short optical pulses can be generated. The temporal waveform of the optical pulse obtainable with this method is intermediate between squared hyperbolic secant and Gaussian waveforms. By changing the bias voltage from a value at which to obtain an extinction ratio of 10 dB to a value at which to obtain an extinction ratio of 50 dB and by setting the amplitude of each modulating voltage to twice that of the bias voltage, the full width at half maximum of the optical pulse obtainable in this instance changes from 25 to 10% of the period of the sinusoidal voltage. Moreover, since the semiconductor laser is caused to oscillate at a fixed wavelength and since the short optical pulses are produced by the semiconductor electro-absorption type optical modulator without directly modulating the semiconductor laser, the oscillation wavelength of the semiconductor laser is free from variations which are caused by the direct modulation of the laser, and hence it is possible to suppress excessive broadening of the spectrum, thus providing optical soliton pulses.

With the second-mentioned optical pulse generator, semiconductor laser beams of a fixed intensity are applied to the first optical modulator driven by a rectangular voltage which provides a sufficient extinction ratio, and the output light of the optical modulator is applied to the second optical modulator driven by a rectangular voltage which has a time difference between it and the above-mentioned rectangular voltage. By this, the AND operation of the driving waveform is performed in an optical domain, thereby generating short optical pulses. The generation of a very short voltage pulse waveform needs an ultrahigh-speed electronic circuit, and hence is difficult. In contrast thereto, the present invention permits the production of short optical pulses by use of relatively long rectangular voltage pulses. Since the optical pulse width can be changed arbitrarily by setting the time difference between the two rectangular voltage pulses, it is possible to produce an optical pulse shorter than that obtainable with the first-mentioned optical pulse generator. The optical modulators may be either semiconductor electro-absorption type optical modulators or dielectric optical modulators.

With the third-mentioned optical pulse generator, semiconductor laser beams of a fixed intensity are applied to the first semiconductor electro-absorption type optical modulator driven by a bias voltage and a sinusoidal voltage of an amplitude more than twice that of the bias voltage and the output light of the first optical modulator is applied to the second semiconductor electro-absorption type optical modulator driven by a bias voltage and a sinusoidal voltage which has a time difference between it and the above-mentioned sinusoidal voltage and has an amplitude more than twice that of the bias voltage. By this, short optical pulses are produced. By driving the semiconductor electro-absorption type optical modulator with a sinusoidal voltage of an amplitude more than twice that of the bias voltage, an optical pulse waveform of very short rise and fall times can be obtained owing to the nonlinearity of the optical output characteristic. By clipping the optical output pulse of the first semiconductor electro-absorption type optical modulator by the second semiconductor electro-absorption type optical modulator, it is possible to obtain an optical pulse of very short rise and fall times. Since the optical pulse width can be changed arbitrarily by setting the time difference between the two sinusoidal voltages, it is possible to produce optical pulses shorter than those obtainable with the first- and second-mentioned optical generators.

BRIEF DESCRIPTION OF THE DRAWINGS

The present invention will be described in detail below with reference to the accompanying drawings, in which.

DETAILED DESCRIPTION OF PREFERRED EMBODIMENTS

Figures 1A, 1B:
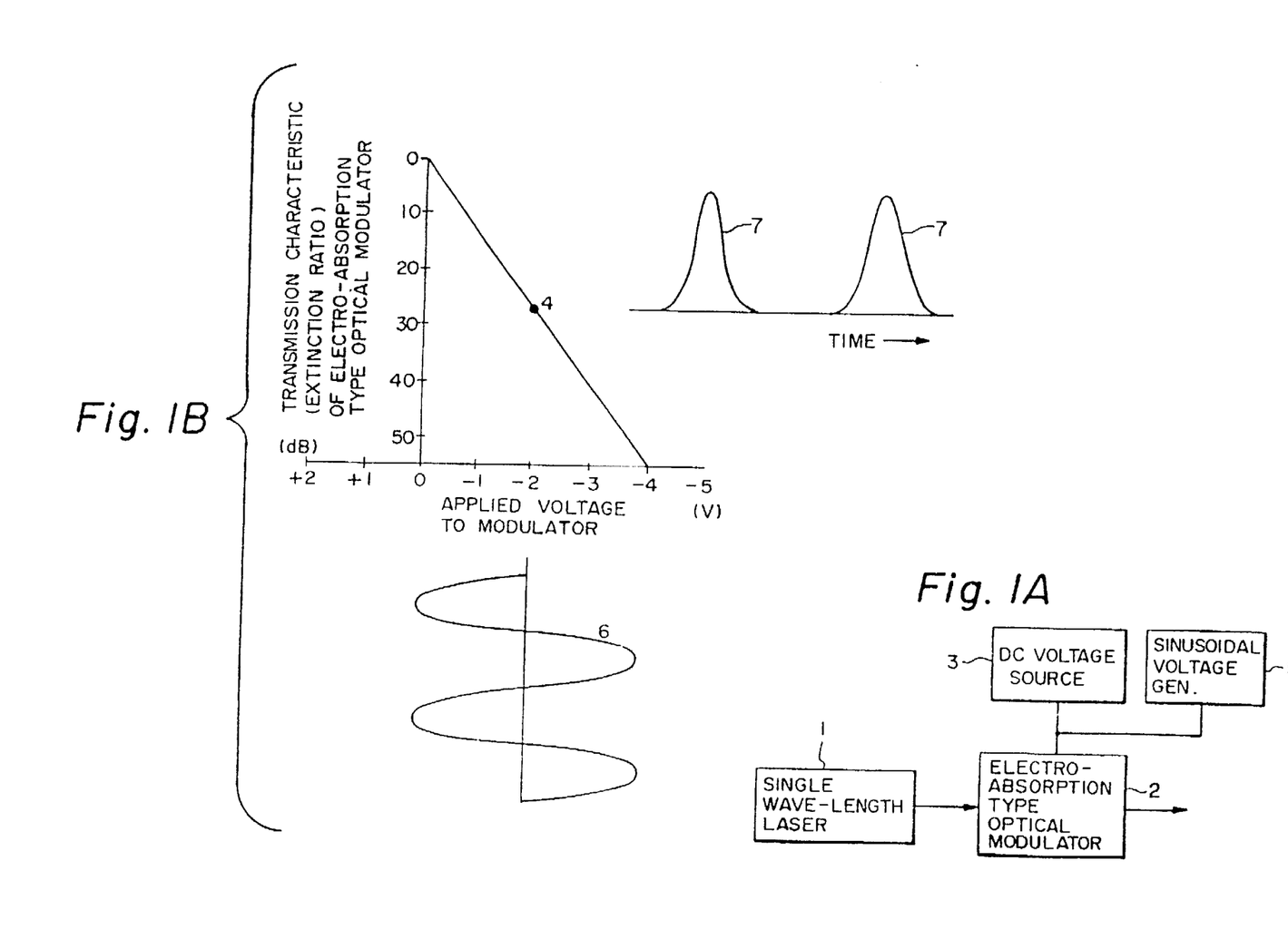
FIG. 1A is a block diagram illustrating in block form a first embodiment of the optical pulse generator of the present invention which uses a semiconductor electro-absorption type optical modulator.
FIG. 1B illustrates a characteristic diagram explanatory of the principle of the generation of short optical pulses by the semiconductor electro-absorption type optical modulator in this first embodiment.

A first embodiment is shown in FIG. 1A of a block diagram of the optical pulse generator, FIG. 1B a graph for explaining the principle of generating short optical pulses by a semiconductor electro-absorption type optical modulator.

A description will be given first of the principle of operation of the invention. In FIG. 1A, fixed output light of a 1.55 μm wavelength, which is emitted from an InGaAsP λ/4 shift distributed feedback (DFB) single-wavelength laser 1, is applied to an InGaAsP electro-absorption type optical modulator 2. A forbidden band wavelength of the InGaAsP modulation waveguide layer of the optical modulator 1 is set between 1.44 and 1.5 μm. When supplied with no voltage, the optical modulator 1 is substantially transparent, but it absorbs light and does not transmit it therethrough as a reverse voltage applied thereto increases. FIG. 1B shows, on a log scale, the transmission characteristic (the extinction ratio) of the electro-absorption type optical modulator with respect to the reverse voltage applied thereto. The extinction ratio scaled in dB of the electro-absorption type optical modulator is substantially in proportion to the reverse voltage applied thereto. That is, the optical output is nonlinear with respect to the voltage. A bias voltage 4 is applied from a DC voltage source 3 to a point where substantially no light passes through the optical modulator, as shown in FIG. 1B. Then, the amplitude of a modulation voltage 6 which is the output of a sinusoidal voltage generator 5 is set to around twice larger than that of the bias voltage 4 and the modulation voltage is applied to the optical modulator, by which short optical pulses 7 can be obtained.

To confirm the above-noted effect, the inventors of this application tested the operation of this embodiment which employed an InGaAsP λ/4 shift DFB laser oscillating at a single wavelength of 1.55 μm and an electro-absorption type optical modulator having an InGaAsP modulation waveguide layer of a 1.45 μm forbidden band wavelength. In this tests, when the bias voltage was −3 V, the optical modulator output was reduced down to 1/100 (an extinction ratio of 20 dB) that in the case of the bias voltage being zero. Furthermore, by applying a 5-GHz sinusoidal modulation voltage of a 6 V amplitude to the optical modulator, an ultrashort optical pulse was obtained which had a full width at half maximum of 40 picoseconds. When the bias voltage was changed from −2 V to −6 V and the amplitude of the bias voltage was set twice the bias voltage, the full width at half maximum of the optical pulse changed from 49 picoseconds to 22 picoseconds. Since the period of the sinusoidal voltage was 200 picoseconds, pulse widths in the range of 24.5 to 11% of the period were obtained.

The present invention does not utilize such an optical resonator as in the case of the prior art example, and hence permits arbitrary setting of the modulation rate. In the tests of this embodiment, the frequency of the sinusoidal voltage was set to 15 and 20 GHz. When the bias voltage was −2 V and the amplitude of the sinusoidal voltage was 7.2 V, short optical pulses whose full widths at half maximum were 14 and 11 picoseconds were obtained when the frequency of the sinusoidal voltage was 15 and 20 GHz, respectively. Since the 3 dB bandwidth of the frequency characteristic of the optical modulator used was 7 GHz, the modulation efficiency at 15 and 20 GHz was 4 and 6 dB lower than that in the case of DC voltage. It was found, however, that the modulation rate could freely be selected, in principle, by increasing the modulating voltage in a manner to make up for such deterioration of the modulation efficiency.

Next, measurements of light spectrums were made. The full widths at half maximum of the spectral envelop of temporal waveforms which has repetition frequencies of 5 and 15 GHz and full widths at half maximum of 22 and 14 picoseconds were 14 and 23 GHz, respectively. The product of the full width at half maximum of the temporal waveform and the full width at half maximum of the spectral envelop was 0.32 in either case. This value is very close to the product, 0.315, of the full width at half maximum of the temporal waveform and the full width at half maximum of the spectral envelop of the squared hyperbolic secant waveform which is the requirement for the soliton pulse. The optical pulse obtainable with the present invention substantially satisfies the soliton requirement and has a pulse width to be 20% of or smaller than the pulse interval, and hence it can be applied to the soliton fiber optic communication system. Then, a train of short pulses having a 60 psec full width at half maximum and a 2.48 GHz repetition frequency, produced by the pulse generator of this embodiment, was transmitted over an optical fiber 10,000 km long and pulse waveforms were observed. No remarkable deterioration was observed in the pulse waveforms even after the pulses were transmitted 10,000 km. This proves that the optical pulse generator of this embodiment can be used as a soliton light source for a long distance optical soliton communication.

Incidentally, the light output characteristic in logarithmic scale or the extinction ratio scaled in dB of the electro-absorption type optical modulator need not always be linear to the applied voltage. In the case where the extinction ratio linearly increases in a low voltage region and the rate of its increase in a high voltage region slightly lowers, the resulting temporal waveform becomes closer to the squared hyperbolic secant waveform. This phenomenon was observed when the optical axes of an optical fiber and optical modulators disposed at its input and output ends with lenses or the like interposed therebetween were slightly out of alignment.

In the case where the extinction ratio scaled in dB linearly increases in the low voltage region and the rate of its increase slightly increases in the high voltage region, the resulting temporal waveform becomes very close to the Gaussian waveform. In either case, such a waveform variation is permissible in the case of the soliton light source. Moreover, when the wavelength of light incident to the optical modulator was changed from 1.52 to 1.57 μm in this embodiment, short optical pulses of about the same waveform could be obtained.

The pulse generator of this embodiment permits easy adjustment of the pulse width, and hence can be used not only to generate optical soliton pulses but also as an optical pulse generator which utilizes ordinary return-to-zero codes. The optical pulse generator of this embodiment does not employ an optical resonator, and hence is advantageous in that it is insusceptible to changes in temperature and other environmental conditions, that the modulation rate is variable, and that short optical pulses for the soliton communication, which is free from excessive spectral line broadening, can easily be generated by use of only the sinusoidal voltage without the necessity of using a special microwave voltage generator.

Figure 10:
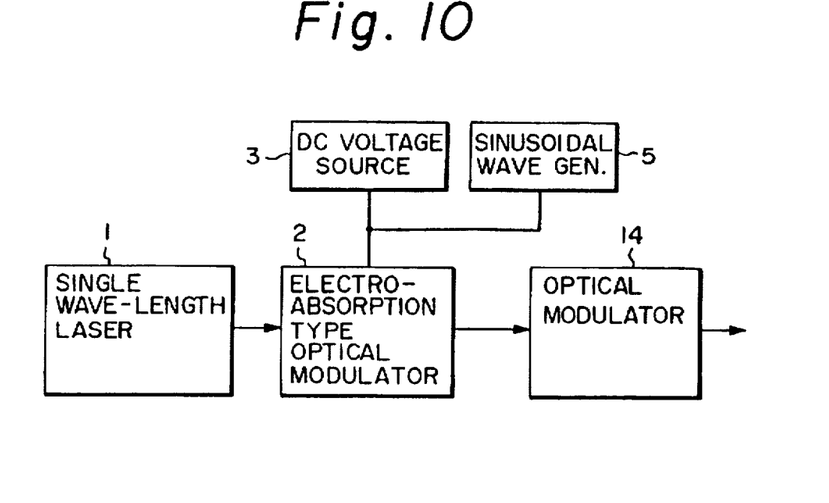
FIG. 10 is a block diagram illustrating an embodiment of the present invention from which a modulated light output is obtained.

It is postulated that a practical application of this embodiment will involve the use of a second optical modulator, as shown in FIG. 10, for generating an information signal which is added to the output light of the semiconductor electro-absorption type optical modulator 2.

Figure 2A:
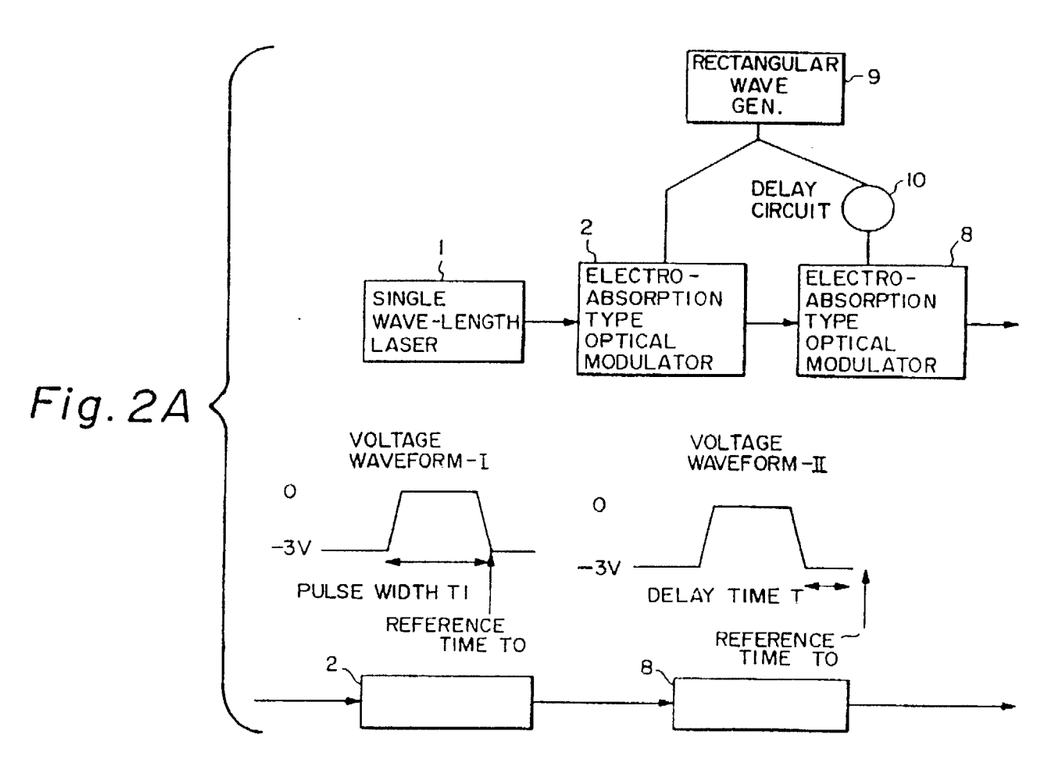
FIG. 2A is a block diagram illustrating a second embodiment of the optical pulse generator of the present invention which employs two semiconductor electro-absorption type optical modulators.
Figure 2B:
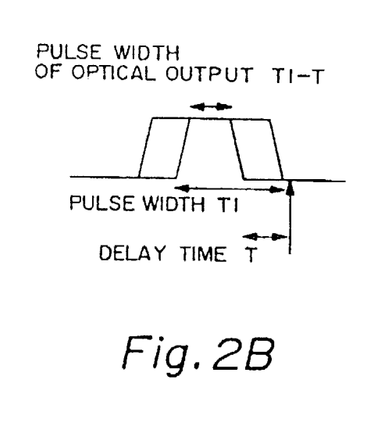
FIG. 2B illustrates time charts explanatory of the principle of the generation of short optical pulses by the semiconductor electro-absorption type optical modulators in this second embodiment.

FIG. 2A is a block diagram illustrating a second embodiment of the present invention and FIG. 2B is a diagram for explaining the principle of generating a short pulse. The feature of this embodiment resides in the generation of short pulses by driving two electro-absorption type optical modulators with modulating voltages of different durations unlike in Embodiment 1.

Fixed output light of a 1.55 μm wavelength, emitted from an InGaAsP λ/4 shift DFB single-wavelength laser 1, is applied to a first InGaAsP electro-absorption type optical modulator 2. The first optical modulator 2 is driven by a rectangular voltage (pulse width T1) of a 3 V amplitude (0 to −3 V) and a 5 GHz repetition frequency, which is one of two outputs branched from the output of a rectangular wave generator 9. Since the rectangular voltage generator 9 can generate a pulse voltage whose rise time and fall time are around 10 picoseconds unlike the sinusoidal voltage generator, optical output pulses from the first InGaAsP electro-absorption type optical modulator 2 are rectangular optical pulses having an extinction ratio of 20 dB or more. These optical pulses are fed to a second InGaAsP electro-absorption type optical modulator 8. The other branched output voltage from the rectangular voltage generator 9 is applied to a delay circuit 10 (of a delay time T) which is formed by a coaxial line or the like, and the delayed rectangular voltage from the delay circuit 10 is applied to the second optical modulator 8 to drive it. With such a construction, an AND operation of the modulating voltage is possible in the optical domain and the light incident to the optical modulator 2 provides, at the output of the optical modulator 8, a short optical pulse of a pulse width corresponding to the time difference between the pulse width T1 and the delay time T. When the delay time is set to 180 picoseconds, the pulse width, T1−T, of the optical output pulse is 20 picoseconds or below.

While it is difficult to generate a modulating voltage of a very short pulse width in the stage of an electrical signal, this embodiment permits the production of a short optical pulse of an arbitrary pulse width through utilization of the time difference between two relatively long modulating voltage pulses. Hence, the pulse generator of this embodiment can be used not only to generate optical soliton pulses but also as an optical pulse generator which utilizes ordinary return-to-zero codes.

According to inventors' performance tests of this embodiment employing the above-mentioned InGaAsP electro-absorption type optical modulators, optical waveforms of 20 to 30 psec rise and fall times were obtained as outputs from the optical modulator which was driven by the rectangular voltage. It is possible, therefore, to produce ultrashort pulses having a pulse width of 20 picoseconds or below by the use of two modulators.

Incidentally, since the optical modulators used in this embodiment can be applied to all intensity modulators, their constructions and materials do not matter. Hence, they are not limited specifically to the semiconductor optical modulators but may also be dielectric optical modulators using $LiNbO_3$ or the like.

Figure 11:
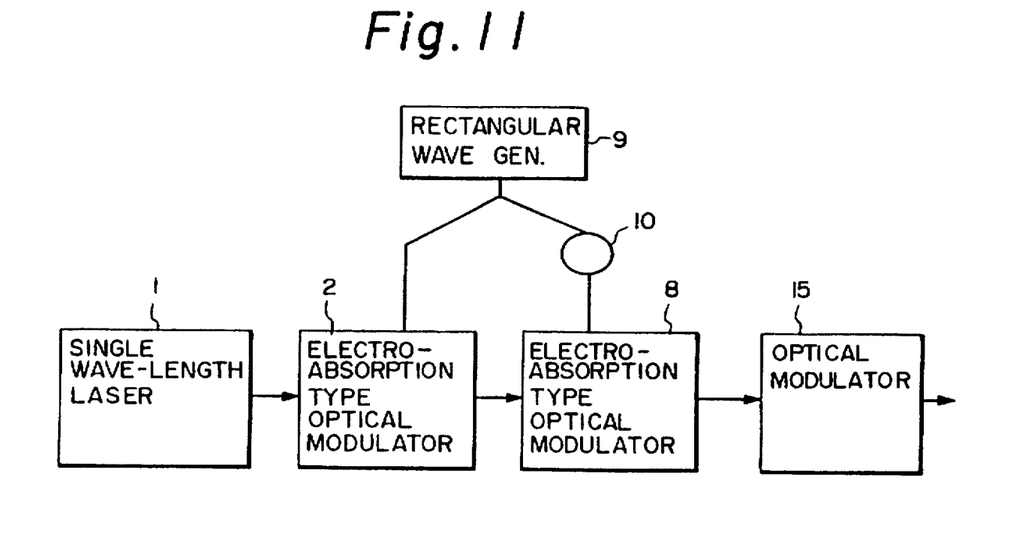
FIG. 11 is a block diagram illustrating an embodiment of the present invention from which a modulated light output is obtained.

It is postulated that a practical application of this embodiment will involve the use of a third optical modulator, as shown in FIG. 11, for producting an information signal which is added to the output light from the semiconductor electro-absorption type optical modulator 8.

Figure 3A:
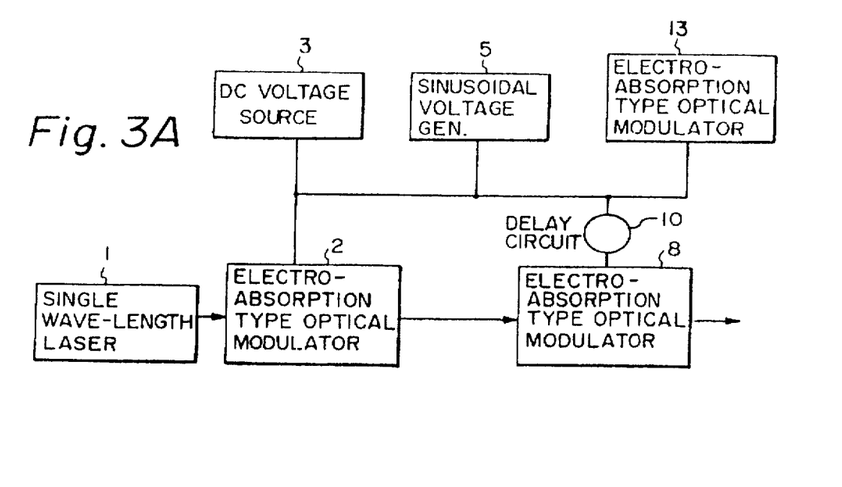
FIG. 3A is a block diagram illustrating a third embodiment of the optical pulse generator of the present invention which employs two semiconductor electro-absorption type optical modulators which are driven by a sinusoidal voltage.
Figure 3B:
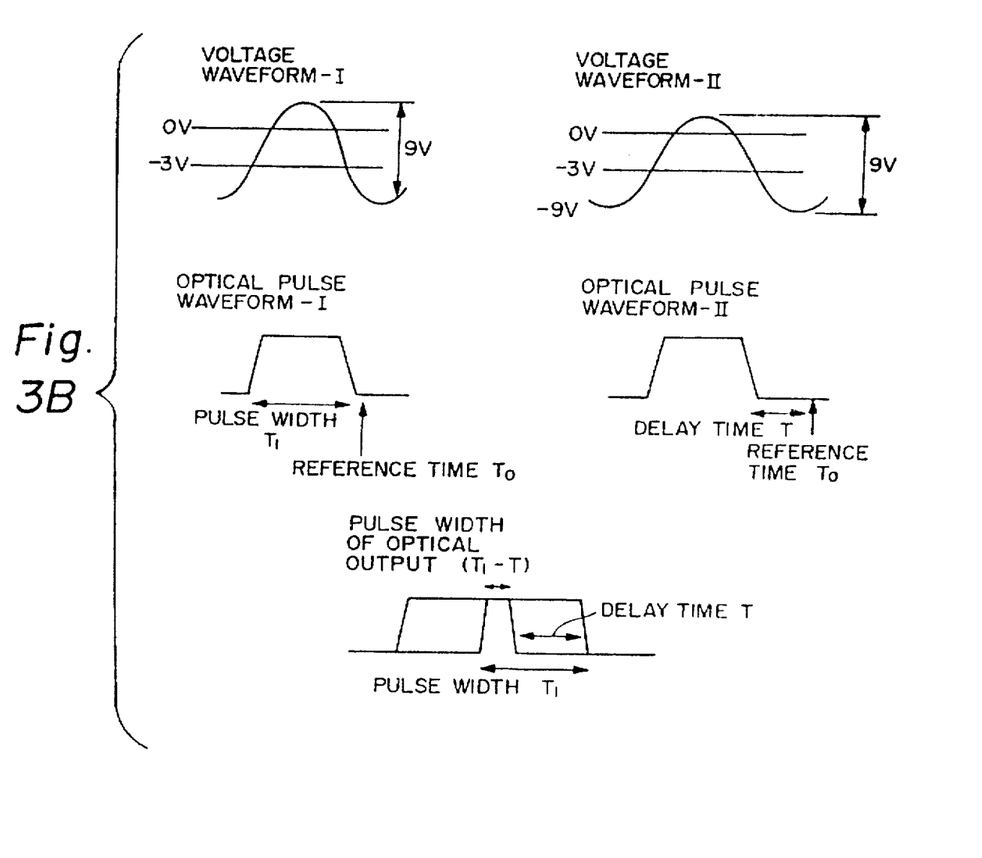
FIG. 3B illustrates waveform diagram explanatory of the principle of the generation of short optical pulses by the semiconductor electro-absorption type optical modulators in this third embodiment.

FIG. 3A is a block diagram illustrating a third embodiment of the present invention and FIG. 3B is a diagram for explaining the principle of generating short pulses. The feature of this embodiment resides in the generation of short pulses by driving two electro-absorption type optical modulators with a sinusoidal modulating voltage and a bias voltage which have a time difference therebetween unlike Embodiment 2.

Fixed output light of a 1.55 μm wavelength, emitted from the InGaAsP λ/4 shift DFB single-wavelength laser 1, is applied to the first InGaAsP electro-absorption type optical modulator 2. A reverse bias voltage −3 V is applied to the first optical modulator 2 from the DC voltage source 3. The output from the sinusoidal generator 5 is branched into two, and a sinusoidal voltage of a 5 GHz frequency, which is one of the two outputs, is applied to the first optical modulator 2 after the amplitude of the sinusoidal voltage is increased to 9 V which is more than twice the bias voltage. When the semiconductor electro-absorption optical modulator is driven by such a sinusoidal voltage of an amplitude more than twice the bias voltage, the optical output characteristic of the optical modulator nonlinearly decreases with respect to the reverse voltage and undergoes substantially no change with respect to a forward voltage as depicted in FIG. 1B. This provides a rectangular optical pulse which is very short in its rise and fall times, and hence the optical output pulse from the first InGaAsP electro-absorption type optical modulator is a rectangular optical pulse which has an extinction ratio of more than 20 dB and is extremely short in its rise and fall times. Such an optical pulse is applied to the second InGaAsP electro-absorption type optical modulator 8. The bias voltage −3 V from the DC voltage source 13 is applied to the second optical modulator 8, to which is further applied the other output sinusoidal voltage branched from the output voltage of the sinusoidal voltage generator 9 via the delay circuit 10 (of the delay time T) formed by a coaxial cable or the like. With such a construction, it is possible to perform the AND operation of the rectangular optical pulse although the optical modulators are driven by the sinusoidal voltage, and the light incident to the optical modulator 2 is derived from the optical modulator 8 as a short optical pulse of a pulse width corresponding to the time difference between the pulse width $T_1$ and the delay time T. When the delay time T is set to 190 picoseconds, the pulse width, $T_1-T$, of the optical output pulse becomes shorter than 10 picoseconds.

Figure 12:
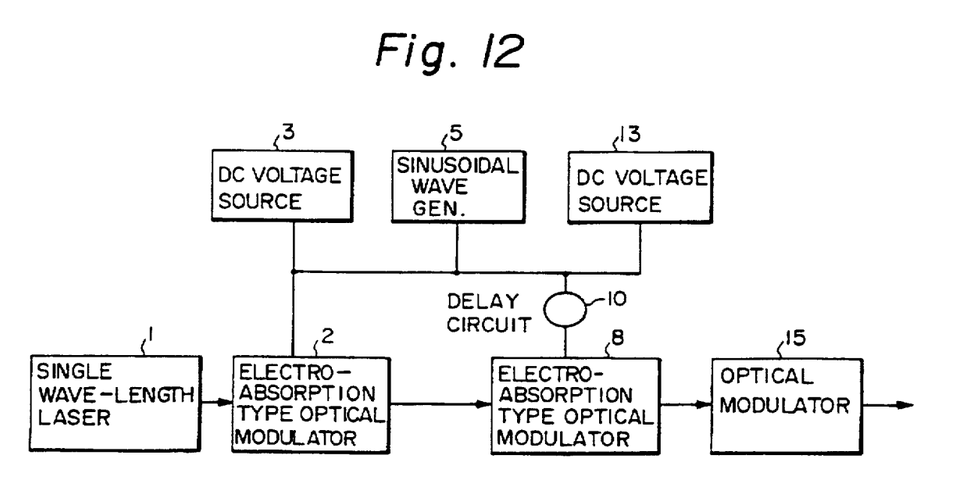
FIG. 12 is a block diagram illustrating an embodiment of the present invention from which a modulated light output is obtained.

Incidentally, it is postulated that a practical application of this embodiment will involve the use of a third optical modulator, as shown in FIG. 12, for producing an information signal which is added to the output light of the semiconductor electro-absorption type optical modulator 8.

Figure 4:
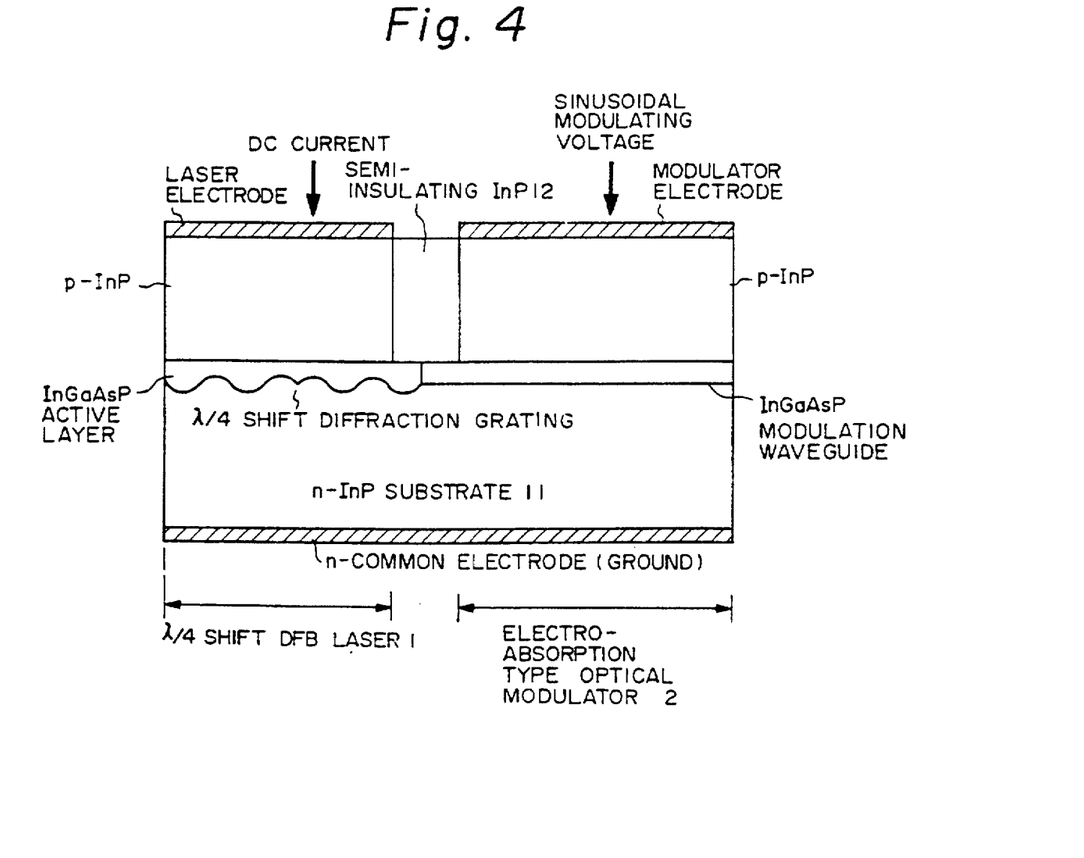
FIG. 4 is a sectional view showing the internal construction of a fourth embodiment in which a semiconductor laser and an electro-absorption type optical modulator for generating pulses are integrated as a unitary structure.

FIG. 4 is a sectional view illustrating, as a part of a fourth embodiment of the present invention, a device or element in which the afore-mentioned semiconductor laser and the electro-absorption type optical modulator for generating short pulses are integrated. The InGaAsP λ/4 shift DFB single-wavelength laser 1 and the InGaAsP electro-absorption type optical modulator 2 used in the optical pulse generator of Embodiment 1 are integrated on an InP semiconductor substrate 11. The both elements are electrically isolated by a semi-insulating InP layer 12.

The inventors made an integrated device in which the laser portion was 300 µm long, the semi-insulating InP layer 12 was 50 µm long and the modulator portion was 290 µm long. Either end face of the integrated device is coated with an anti-reflection film to suppress variations in the oscillation wavelength which is caused by the reflection of light from the optical modulator to the laser. The electric isolation resistance between the laser and the optical modulator is 1 megohm and suppresses the electric interference between them. The isolation resistance of 1 megohm is enough large to suppress wavelength variations of the laser and to obtain the transform-limited short pulses. The forbidden band energy of an InGaAsP modulating waveguide layer is 1.45 µm. When a 180 mA direct current was applied to the laser portion, it oscillated at a single wavelength of 1.55 µm, and when a −2 V bias voltage was applied to the modulator portion, an extinction ratio of 25 dB was obtained. Moreover, when a sinusoidal voltage of a 5 GHz frequency and a 4 V amplitude was provided to the optical modulator portion, an optical pulse was obtained the full width at half maximum of which was 33 picoseconds. It was ascertained that the product of full width at half maximum of the temporal waveform and the full width of half maximum of the spectral envelop was 0.31, which is very close to the value of 0.315 for transform-limited $sech^2$ pulse and sufficient for the soliton light source.

While this embodiment has been described to employ an InGaAsP λ/4 shift DFB laser as the single-wavelength laser, it may also be replaced by other single-wavelength lasers of any construction, such as a distributed Bragg-reflector laser and an ordinary DFB laser using a homogeneous or uniform diffraction grating, and a variable wavelength laser is also applicable. Moreover, this embodiment is not limited specifically to semiconductor materials of any particular series, and a quantum well structure may also be applied to the active layer of the laser and the modulating waveguide layer.

The feature of the optical pulse generator according to this embodiment lies in that since the laser and the modulator are formed as a unitary structure, the optical coupling loss between them is substantially reduced in the one-chip semiconductor device and the DC voltage and the sinusoidal voltage are small because of high modulation efficiency.

Figure 5:
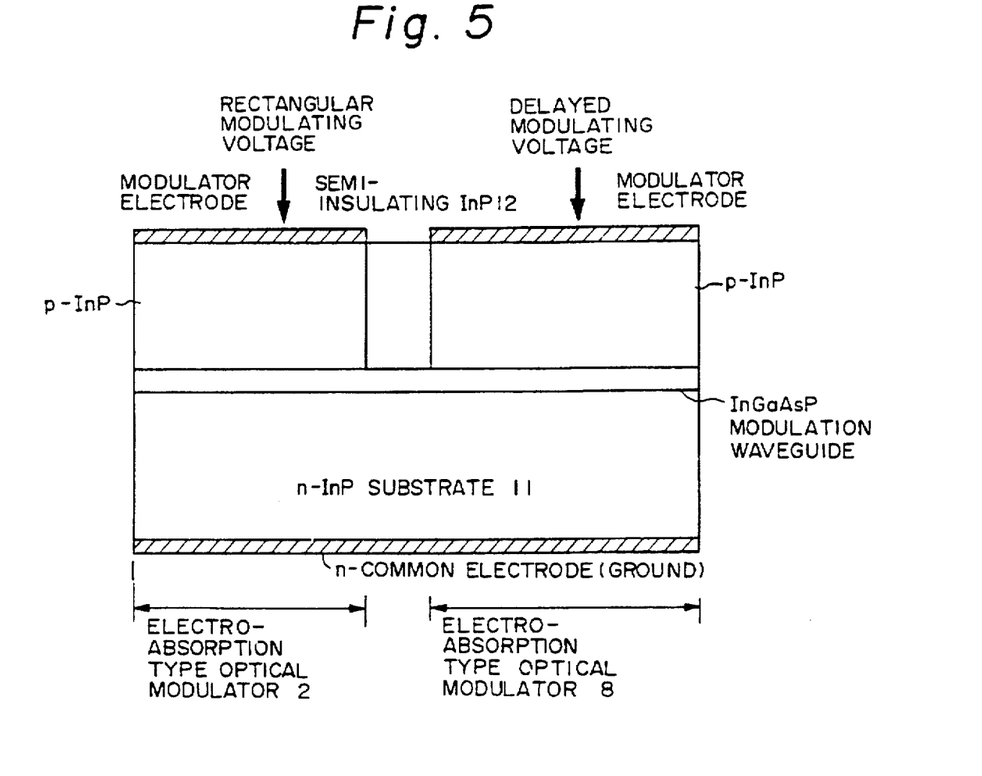
FIG. 5 is a sectional view showing the internal construction of a fifth embodiment in which two electro-absorption type optical modulators for generating pulses are integrated as a unitary structure.

FIG. 5 is a sectional view illustrating, as a part of a fifth embodiment of the invention, a device in which two electro-absorption type optical modulators for generating short pulses are integrated. In this embodiment, the two InGaAsP electro-absorption type optical modulators 2 and 8 used in Embodiments 2 and 3 are integrated on the InP semiconductor substrate 11. The both elements are electrically isolated from each other. The integrated elements are formed by InGaAsP modulating layers of the same composition, and hence are easy of crystal growth and cause no optical coupling loss between them. The electro-isolation resistance between the both elements can be made more than 1 megohm by the adoption of the semi-insulating InP layer 12.

An integrated optical modulator for optical pulse generator of this embodiment comprises a semiconductor substrate, a first optical modulator for modulating an intensity of an input light, and a second optical modulator for modulating the intensity of the output light from the first optical modulator, and moreover, the first optical modulator and the second optical modulator are integrated as a unitary structure on the semiconductor substrate.

The feature of this embodiment resides in that no optical coupling loss is caused between the two optical modulators because they are formed as a unitary structure.

Figure 6:
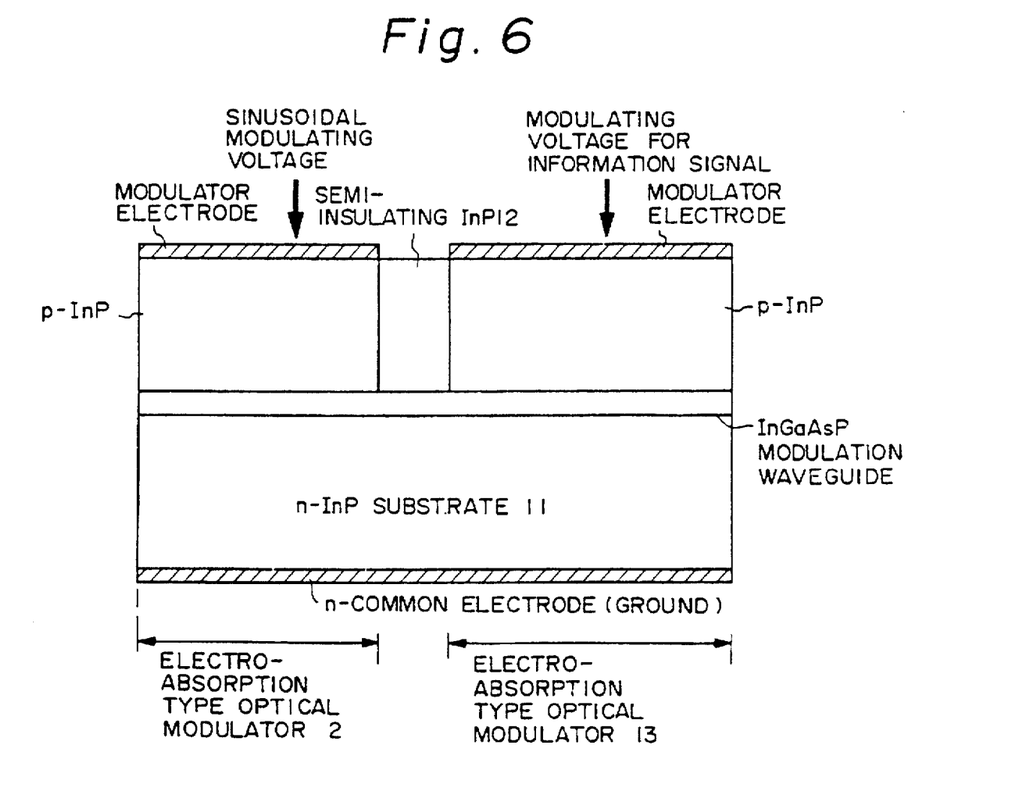
FIG. 6 is a sectional view showing the internal construction of a sixth embodiment in which two electro-absorption type optical modulators for generating pulses and information signals, respectively, are integrated as a unitary structure.

FIG. 6 is a sectional view illustrating, as a part of a sixth embodiment of the present invention, a device in which an electro-absorption type optical modulator for generating short pulses and an electro-absorption type optical modulator for generating information signals are integrated. In this embodiment, the InGaAsP electro-absorption type optical modulator 2 for generating short pulses, used in Embodiment 1, and an InGaAsP electro-absorption type optical modulator 13 for producing information signals are integrated on the InP semiconductor substrate 11, and the both elements are electrically isolated from each other by the semi-insulating InP layer 12.

An integrated optical modulator for optical pulse generator of this embodiment comprises a semiconductor substrate, a semiconductor electro-absorption type optical modulator for modulating an intensity of an input light, and an optical modulator for modulating the intensity of the output light from the first optical modulator, and moreover, the semiconductor electro-absorption type optical modulator and the optical modulator are integrated as a unitary structure on the semiconductor substrate.

The feature of this embodiment resides in the additional provision of a signal generating modulator to Embodiment 1 without causing an increase in the optical loss.

Figure 7:
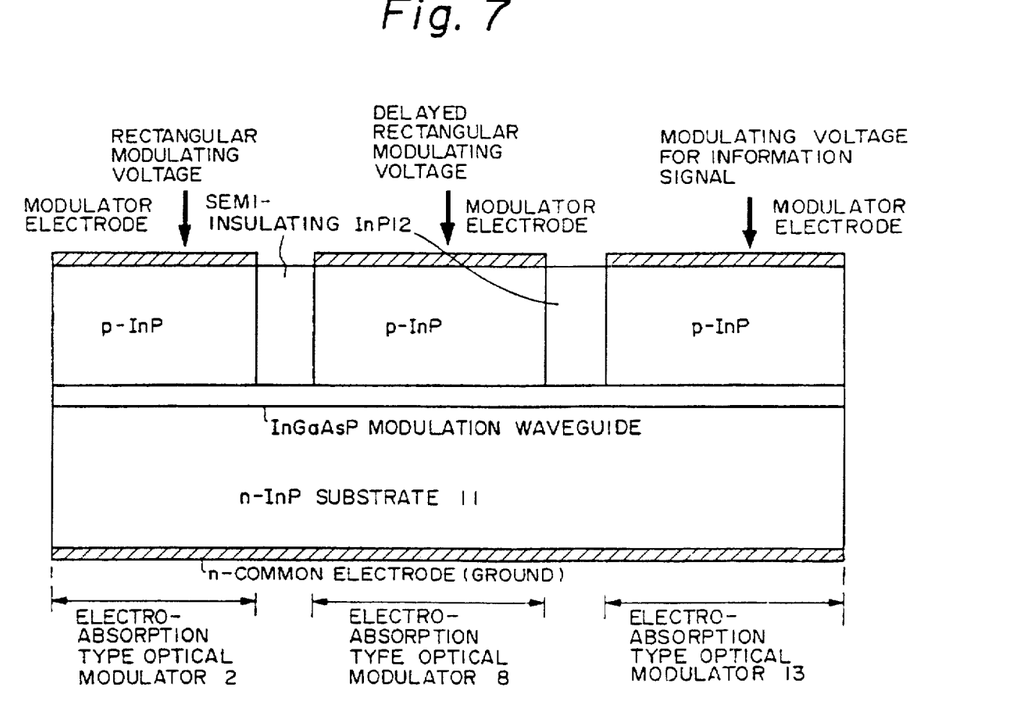
FIG. 7 is a sectional view showing the internal construction of a seventh embodiment in which three electro-absorption type optical modulators are integrated as a unitary structure.

FIG. 7 is a sectional view illustrating, as a part of a seventh embodiment of the present invention, a device in which two electro-absorption type optical modulators for generating short pulses and an electro-absorption type optical modulator for generating information signals are integrated. In this embodiment, the two InGaAsP electro-absorption type optical modulators 2 and 8 in Embodiment 5 and an InGaAsP electro-absorption type optical modulator 13 for generating information signals are integrated together on the InP semiconductor substrate 11, and the three elements are electrically isolated by the semi-insulating InP layer 12.

An integrated optical modulator for optical pulse generator of this embodiment comprises a semiconductor substrate, a first optical modulator for modulating an intensity of an input light, a second optical modulator for modulating the intensity of the output light from the first optical modulator, and a third optical modulator for modulating the intensity of the output light from the second optical modulator, and moreover, the first optical modulator, the second optical modulator and the third optical modulator are integrated as a unitary structure on the semiconductor substrate.

The feature of this embodiment is a fact that the signal generating modulator can be newly added to Embodiment 5 without causing an increase in optical loss, because the three modulators are formed as a unitary structure.

Figure 8:
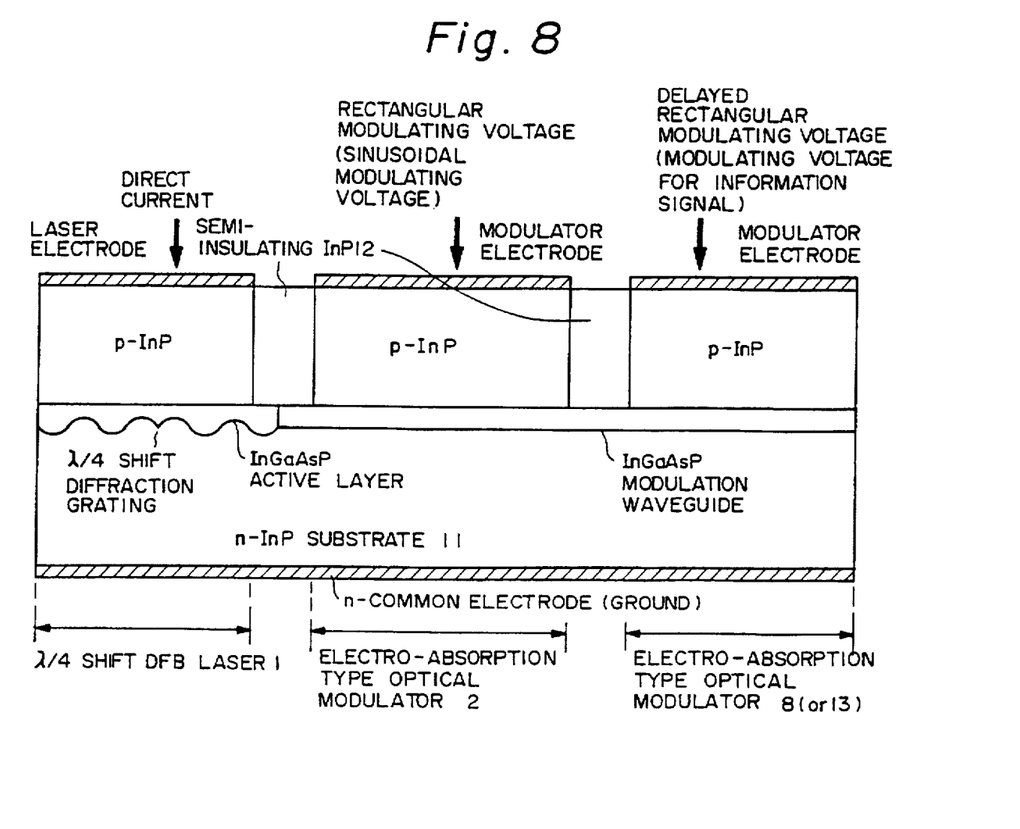
FIG. 8 is a sectional view showing the internal construction of an eighth embodiment in which two electro-absorption type optical modulators for generating pulses and information signals, respectively, and a semiconductor laser are integrated as a unitary structure.

FIG. 8 is a sectional view illustrating, as a part of an eighth embodiment of the present invention, a device in which two electro-absorption type optical modulators and a semiconductor laser are integrated. In this embodiment, the two InGaAsP electro-absorption type optical modulators 2 and 8 in Embodiment 5 or the InGaAsP electro-absorption type optical modulator 2 for generating short pulses and the InGaAsP electro-absorption type optical modulator 13 for generating information signal in Embodiment 6 are integrated on the InP semiconductor substrate 11, together with the InGaAsP λ/4 shift DFB single-wavelength laser 1. The three elements are electrically isolated by the semi-insulating InP layer 12.

An integrated optical pulse generator for optical soliton communications of this embodiment comprises a semiconductor substrate, a semiconductor laser for continuously oscillating an output light at a single wavelength, a first optical modulator for modulating an intensity of an input light, and a second optical modulator for modulating the intensity of the output light from the first optical modulator, and moreover, the semiconductor laser, the first optical modulator and the second optical modulator are integrated as a unitary structure on the semiconductor substrate.

Figure 9:
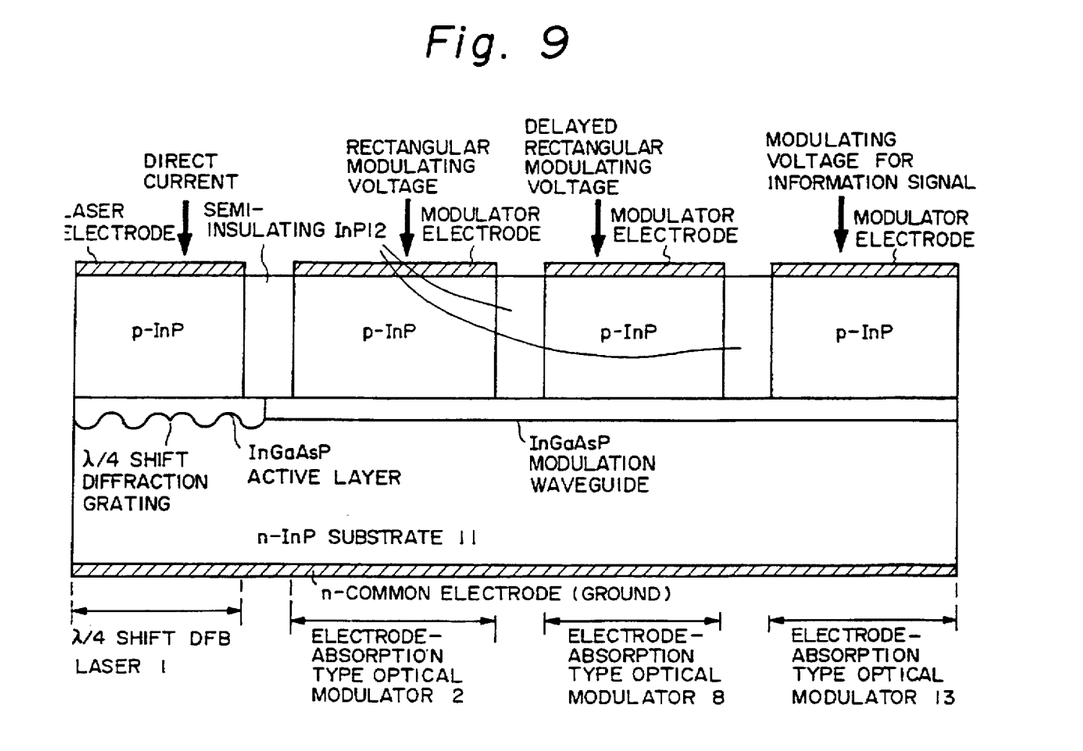
FIG. 9 is a sectional view showing the internal construction of a ninth embodiment in which three electro-absorption type optical modulators and a semiconductor laser are integrated as a unitary structure.

FIG. 9 is a sectional view illustrating, as a part of a ninth embodiment of the present invention, a device in which two electro-absorption type optical modulators for generating short pulses, another electro-absorption type optical modulator for generating information signals and a semiconductor laser are integrated. In this embodiment, the two InGaAsP electro-absorption type optical modulators 2 and 8 for generating short pulses and the InGaAsP electro-absorption type optical modulator 13 for generating information signals in Embodiment 7 and the InGaAsP λ/4 shift DFB single-wavelength laser 1 are integrated as a unitary structure on the InP semiconductor substrate 11. The four elements are electrically isolated by the semi-insulating InP layer 12.

An integrated optical pulse generator for optical soliton communications of this embodiment comprises a semiconductor substrate, a semiconductor laser for continuously oscillating an output light at a single wavelength, a first optical modulator for modulating an intensity of an input light, a second optical modulator for modulating the intensity of the output light from the first optical modulator, and a third optical modulator for modulating the intensity of the output light from the second optical modulator, and moreover, the semiconductor laser, the first optical modulator, the second optical modulator, and the third optical modulator are integrated as a unitary structure on the semiconductor substrate.

With the construction of this embodiment, it is possible to obtain a short pulse generator of extremely low loss since the laser, the two short pulse generating modulators and the information signal generating modulator are formed as a unitary structure.

While in the above the present invention has been described to employ InGaAsP electro-absorption type optical modulators, it is also possible to use absorption type optical modulators of a quantum well structure wherein the quantum well layer is formed by an InGaAsP or InGaAs layer and a quantum barrier layer is formed by an InP or InGaAsP layer which has a forbidden band energy larger than that of the quantum well layer. Furthermore, absorption type optical modulators of InGaAlAs/InAlAs and InGaAs/InAlAs quantum well structures can also be used in the present invention.

The two optical modulators for generating short optical pulses and the modulator for generating information signals can be formed by any kinds of intensity modulator irrespective of their constructions and materials. Hence, the optical modulators for use in the present invention are not limited specifically to semiconductor optical modulators but may also be dielectric optical modulators using $LiNbO_3$ or the like.

As regards the integrated optical pulse generator, two or more arbitrary combinations of the laser and the modulators are possible and the above-mentioned quantum well structure can be used.

Although in the above the pulse generators of the present invention have been described to be used for the soliton optical communication, they can also be used as optical pulse generators utilizing ordinary return-to-zero codes.

Moreover, ultrashort optical pulses having a pulse width of 1 picosecond or less could be obtained by utilizing the nonlinearity of an optical fiber or pulse compression effect by a saturable absorber after the generation of optical pulses by the present invention.

The present invention has such a construction as described above, and hence produces the following effects.

The optical pulse generator according to the first aspect of the invention achieves the variable modulation rate and suppresses the excessive spectral line broadening, both impossible with the prior art, by a simple method which employs a semiconductor laser, an electro-absorption type optical modulator, a DC voltage source and a sinusoidal voltage generator, and the pulse generator is capable of generating ultrashort optical pulses free from the excessive spectral line broadening, and hence is very promising as an optical pulse generator for the soliton communication which is stable and reliable for a long period of time.

The optical pulse generator according to the second aspect of the invention is able to produce short optical pulses of arbitrary pulse widths by changing the delay time of a rectangular voltage signal to be applied to one of two optical modulators, and hence is capable not only of achieving the variable modulation rate and suppressing the excessive spectral line broadening but also of easily generating short optical pulses of a pulse width smaller than 1/10 the pulse-repetition period. Hence, this pulse generator is also very promising as an optical pulse generator for the soliton communication.

The optical pulse generator according to the third aspect of the invention is capable not only of achieving the variable modulation rate and suppressing the excessive spectral line broadening but also of easily generating short optical pulses of a pulse width smaller than 1/10 the pulse-repetition period, without the need of using any special high-speed electronic circuit, by changing the delay time of a sinusoidal voltage signal to be applied to one of two electro-absorption type optical modulators. Hence, this pulse generator is also very promising as an optical pulse generator for the soliton communication.

The inventors think that the first-mentioned optical pulse generator is most promising from the viewpoints of easiness of handling of the device and its single-frequency operation and that the third-mentioned optical pulse generator is suitable for generating short optical pulses of smaller pulse widths.

What we claim is:

1. An integrated optical modulator for optical pulse generator comprising:

semiconductor substrate;

a first optical modulator for modulating an intensity of an input light, and a second optical modulator for modulating the intensity of the output light from said first optical modulator, said first optical modulator and said second optical modulator being integrated on said semiconductor substrate as a unitary structure, in which said first optical modulator and said second optical modulator have a common modulation waveguide layer and are electrically isolated from each other by a layer of semi-insulating material.

2. An integrated optical modulator for optical pulse generator comprising:

a semiconductor substrate;

a semiconductor electro-absorption type optical modulator for modulating an intensity of an input light, and an optical modulator for modulating the intensity of the output light from said semiconductor electro-absorption type optical modulator, said semiconductor electro-absorption type optical modulator and said optical modulator being integrated on said semiconductor substrate as a unitary structure, in which said semiconductor electro-absorption type optical modulator and said optical modulator have a common modulation waveguide layer and are electrically isolated from each other by a layer of semi-insulating material.

3. An integrated optical modulator for optical pulse generator comprising:

a semiconductor substrate, a first optical modulator for modulating an intensity of an input light, a second optical modulator for modulating the intensive of the output light from said first optical modulator, and a third optical modulator for modulating the intensity of the output light from said second optical modulator, said first optical modulator, said second optical modulator and said third optical modulator being integrated on said semiconductor substrate as a unitary structure, in which said first optical modulator, said second optical modulator and said third optical modulator have a common modulation waveguide layer and are electrically isolated from each other successively by layers of semi-insulating material.

4. An integrated optical modulator for optical pulse generator comprising:

a semiconductor substrate;

a semiconductor laser for continuously oscillating an output at a single wavelength, a first optical modulator for modulating an intensity of an input light, and a second optical modulator for modulating the intensity of the output light from said first optical modulator, said semiconductor laser, said first optical modulator and said second optical modulator being integrated on said semiconductor substrate as a unitary structure, in which said first optical modulator and said second optical modulator have a common modulation waveguide layer and are electrically isolated from each other by a layer of semi-insulating material.

5. An integrated optical modulator for optical pulse generator comprising:

a semiconductor substrate, a semiconductor laser for continuously oscillating an output at a single wavelength, a first optical modulator for modulating an intensity of an input light, a second optical modulator for modulating the intensity of the output light from said first optical modulator, and a third optical modulator for modulating the intensity of the output light from said second optical modulator, said semiconductor laser, said first optical modulator, said second optical modulator and said third optical modulator being integrated on said semiconductor substrate as a unitary structure, in which said first optical modulator, said second optical modulator and said third optical modulator have a common modulation waveguide layer and are electrically isolated from each other successively by layers of semi-insulating material.

* * * * *